United States Patent [19]
Tsukamoto et al.

[11] Patent Number: 5,600,165
[45] Date of Patent: Feb. 4, 1997

[54] SEMICONDUCTOR DEVICE WITH ANTIREFLECTION FILM

[75] Inventors: Masanori Tsukamoto; Tetsuo Gocho, both of Kanagawa, Japan

[73] Assignee: Sony Corporation, Tokyo, Japan

[21] Appl. No.: 507,526

[22] Filed: Jul. 26, 1995

[30] Foreign Application Priority Data

Jul. 27, 1994 [JP] Japan .................................. 6-175526
Jul. 28, 1994 [JP] Japan .................................. 6-177055

[51] Int. Cl.$^6$ .................................................. H01L 31/232
[52] U.S. Cl. .......................... 257/323; 257/411; 257/412; 257/413; 257/437
[58] Field of Search ...................................... 257/437, 639, 257/649, 323, 411, 412, 413

[56] References Cited

U.S. PATENT DOCUMENTS

| | | | |
|---|---|---|---|
| 5,068,697 | 11/1991 | Noda et al. | 257/324 X |
| 5,326,431 | 7/1994 | Kadomura | 216/46 X |
| 5,444,012 | 8/1995 | Yoshizumi et al. | 437/60 |
| 5,459,354 | 10/1995 | Hara | 257/384 X |
| 5,488,246 | 1/1996 | Hayashide et al. | 257/437 X |

FOREIGN PATENT DOCUMENTS

| | | | |
|---|---|---|---|
| 1019760 | 1/1989 | Japan | 257/437 |
| 1065866 | 3/1989 | Japan | 257/437 |

*Primary Examiner*—William Mintel
*Attorney, Agent, or Firm*—Hill, Steadman & Simpson

[57] ABSTRACT

A semiconductor device in which patterning is effected using a silicon oxynitride (SiON) based thin film as an anti-reflection film and in which electrical properties are prohibited from being deteriorated by hydrogen contained in the SiON based thin film. The semiconductor device has a substrate, a gate insulating film formed on the surface of the substrate, a gate electrode formed on the gate insulating film, and a first antireflection film having a pattern in common with the gate electrode. The semiconductor device also has a hydrogen permeation prohibiting film formed between the gate insulating film and the first antireflection film. The first antireflection film contains hydrogen and is formed on the gate electrode.

11 Claims, 12 Drawing Sheets

SEMICONDUCTOR DEVICE WITH ANTIREFLECTION FILM

BACKGROUND OF THE INVENTION

This invention relates to a semiconductor device in which patterning is effected using a silicon oxynitride (SiON) based thin film as an antireflection film. More particularly, it relates to such semiconductor device prohibited from being deteriorated in electrical properties due to hydrogen contained in the SiON based thin film.

As a material for metallization of a semiconductor device, an aluminum (Al) based alloy or a high melting metal silicide is used extensively. It is becoming indispensable to provide an antireflection film on the surface of such material having high light reflectance for the purpose of improving accuracy in photolithography. The reason is that, in keeping pace with the tendency towards a finer design rule of the semiconductor device, the light exposure wavelength for a photoresist coating film shifts to a short wavelength side and, in addition, the pattern size is approaching to the wavelength of the exposure light, so that stable resolution is becoming difficult to achieve on a layer of a material exhibiting high light reflectance.

Above all, if an exposure light source having strong monochromaticity, such as excimer laser light, is used, standing wave effects are manifested intensively unless an anti-reflection film is used, with the result that a resist pattern may be deformed or the resulting metallization pattern tends to be fluctuated in linewidth.

As such antireflection film, an SiON based thin film is attracting attention because its optical constants may be set arbitrarily. Since the SiON based thin film can be formed by a chemical vapor deposition (CVD) method using a plasma, and the optical constants thereof may be controlled by changing the atomic composition ratio in the film, it can be applied to photolithography employing the excimer laser light.

Figure 1:
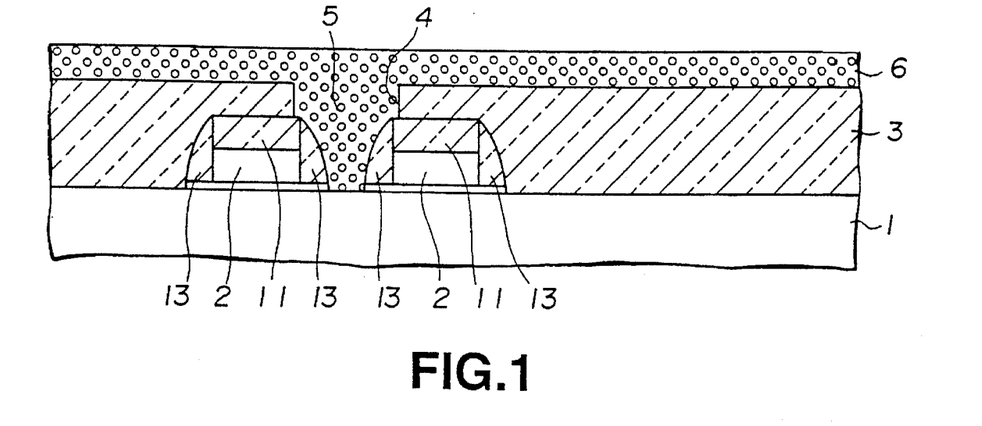
FIG. 1 is a schematic cross-sectional view showing an illustrative construction of a conventional semiconductor device.

FIG. 1 shows, as a semiconductor device in which an antireflection film comprised of an SiON based thin film used for photolithography is left, a static RAM (SRAM) in which connection across a thin film transistor (TFT) as a load and a memory node is achieved via a contact hole which has been opened in a self-aligned manner. With the present SRAM, a contact hole 4 is opened in a self-aligned manner in an SiO based interlayer insulating film 3 between two neighboring gate electrodes 2 on a silicon (Si) substrate 1. A polysilicon metallization layer 6 is formed while burying the contact hole 4 for electrically interconnecting the Si substrate 1 and a polysilicon metallization layer 6. Although not shown, an antireflection film used during patterning of the gate electrode 2 is left on the SRAM.

Figure 2:
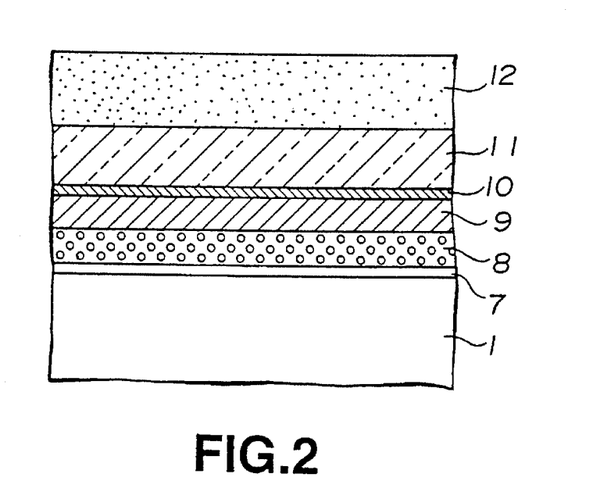
FIG. 2 is a schematic cross-sectional view showing a production process for a wafer shown in FIG. 2, in which, after formation of an antireflection film on a tungsten silicide layer, an offset oxide film and a photoresist coating film have been formed.
Figure 3:
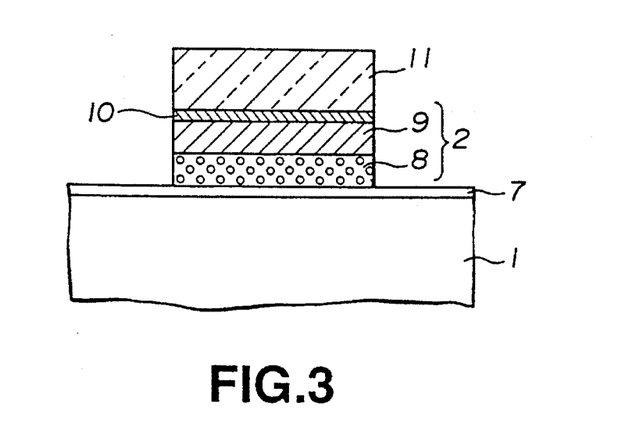
FIG. 3 is a schematic cross-sectional view showing the state in which, with the wafer of FIG. 2, the gate electrode has been patterned.

Referring to FIGS. 1 to 3, the process employing the antireflection film is explained. Referring first to FIG. 2, a gate insulating film 7 is formed by thermal oxidation on the Si substrate 1. After forming a polysilicon layer 8 and a tungsten silicide layer 9, and forming an antireflection film 10 on the tungsten silicide layer 9, an offset oxidized film 11 is formed, followed by a photoresist coating film 12. Selective light exposure of the photoresist coating film 12 is then performed while the strong light of reflection from the tungsten silicide layer 9 is prohibited by the antireflection film 10. Then, using a photoresist pattern, formed by a development process, as a mask, the offset oxidized film 11, the antireflection film 10, tungsten silicide layer 9 and the polysilicon layer 8 are etched sequentially for patterning the gate electrode 2 to a desired configuration.

Then, as shown in FIG. 1, a sidewall 13 and the SiO based insulating film 3 are formed, and the contact hole 4 is opened in a self-aligned manner between the neighboring gate electrodes 2. The polysilicon metallization layer 6 is formed while burying the contact hole 4, and the polysilicon layer 8 is patterned to produce the SRAM shown in FIG. 1.

In the course of a process subsequent to formation of the gate electrode 2, it is desirable that the reflected light from the tungsten silicide layer 9 be prohibited during the photolithographic process. The antireflection film 10 previously formed on the gate electrode 2 is useful for this purpose.

Figure 4:
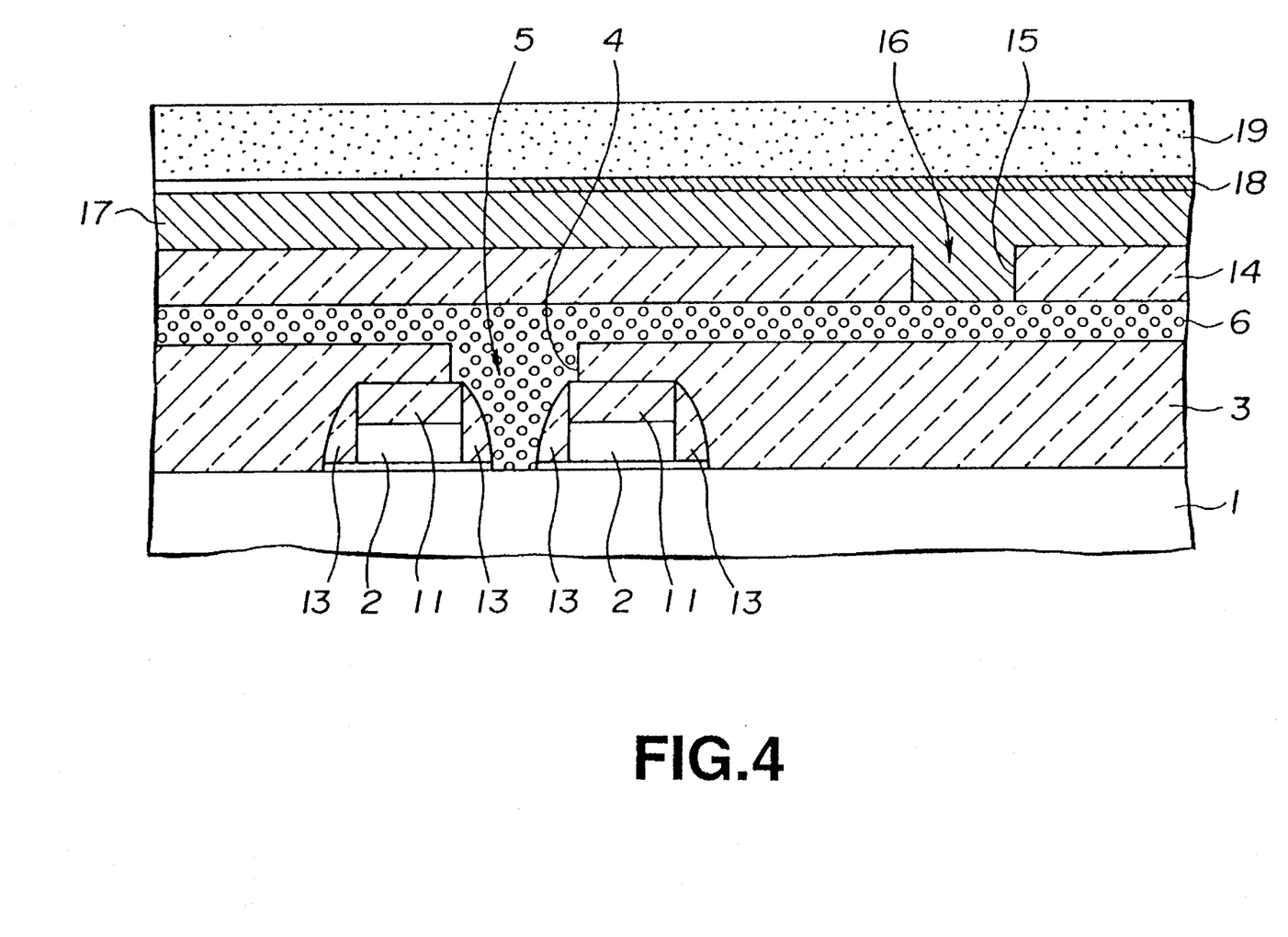
FIG. 4 is a schematic cross-sectional view showing the state in which, with the wafer of FIG. 1, an Al metallization layer for electrical connection to the polysilicon metallization layer has been formed and a photoresist coating film has been formed for patterning the Al metallization layer.

With the above-described SRAM, an antireflection film formed of a SiON based thin film is used for formation of an upper metallization layer. Specifically, an antireflection film 18 is employed when a SiO based interlayer insulating film 14 is formed for covering the polysilicon metallization layer 6, a via-hole 15 is opened in the SiO based interlayer insulating film 14, an Al metallization layer 17 is formed on the overall surface while burying the via-hole 15, and the Al metallization layer 17 is subsequently patterned.

That is, by forming the antireflection layer 18 after formation of the Al metallization layer 17 and before coating a photoresist coating film 19, the photoresist coating film 19 may be selectively exposed to light while the strong light of reflection from the Al metallization layer 17 is prohibited, as a result of which the Al metallization layer 17 may be patterned to a desired configuration. The Al metallization layer 17 and the polysilicon metallization layer 6 may be electrically connected by an Al plug 16 embedded in the via-hole 15.

Figure 5:
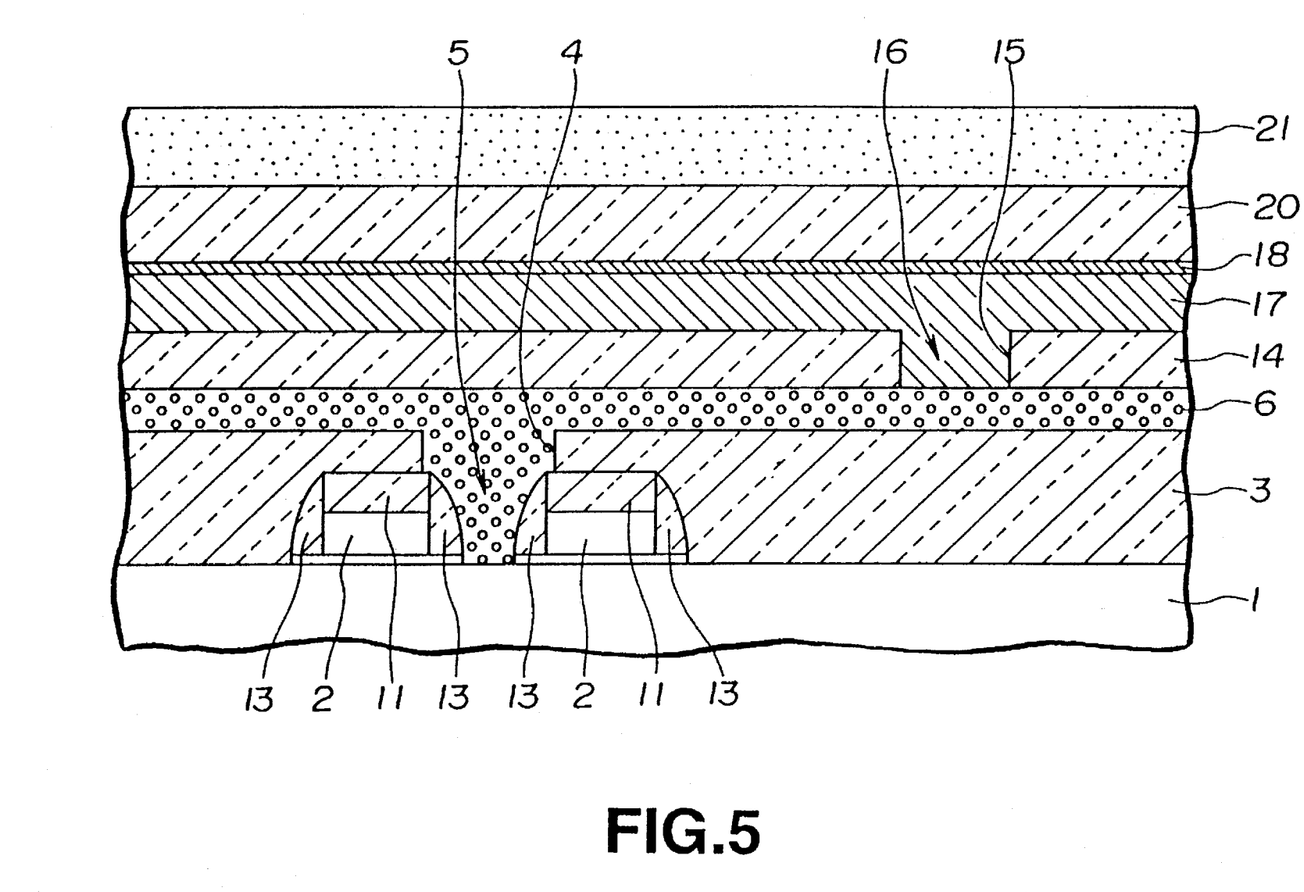
FIG. 5 is a schematic cross-sectional view showing the state in which, with the wafer of FIG. 2, the photoresist coating film has been formed for opening a via-hole in a SiO based interlayer insulating film on the Al metallization layer.

When forming further metallization on the thus patterned Al metallization layer 17, an antireflection film is similarly required. That is, as shown in FIG. 5, the strong light of reflection from the Al metallization layer 17 needs to be prohibited during selective light exposure of a photoresist coating film 21 if a via-hole is to be opened in the SiO based interlayer insulating film 20 formed for covering the Al metallization layer 17. For this reason, the antireflection film 18 on the Al metallization layer 17 is left after patterning of the Al metallization layer 17 and again used during selective light exposure of the photoresist coating film During the production process for the SRAM, as described above, the antireflection films 10, 18 formed of SiON based thin films are used for suppressing the effect of the reflected light from the underlying layer during selective light exposure of the photoresist coating films 12, 19 and 21.

With the wafer produced by the above process, SiON based thin films persist as the antireflection films 10, 18 on the gate electrode 2 and the Al metallization layer 17. These SiON based thin films contain hydrogen in an amount of the order of 20% such that, when heat is applied during the process of passivation or annealing for activating impurities subsequent to formation of the antireflection films 10, 18, the phenomenon of hydrogen diffusion to the ambient area occurs. If hydrogen diffused in this manner reaches the gate insulating film 7, there is a risk of deteriorating the so-called resistance against hot carriers.

In order to avoid this phenomenon, it may be contemplated to remove the antireflection film each time it has been employed. However, since it may occur that a proper selection ratio between the antireflection film and the underlying layer cannot be maintained or the same antireflection film can be used only once, a step of forming the antireflection film needs to be carried out for each photographic process.

SUMMARY OF THE INVENTION

It is therefore an object of the present invention to provide a semiconductor device in which hydrogen diffusion to the gate insulating film may be prohibited even although the antireflection film formed of a SiON based thin film is left.

According to the present invention, there is provided a semiconductor device having a substrate, a gate insulating film formed on the surface of the substrate, a gate electrode formed on the gate insulating film and a first antireflection film having a pattern in common with the gate electrode. The first antireflection film contains hydrogen and is formed on the gate electrode. A hydrogen permeation prohibiting film is formed between the gate insulating film and the first antireflection film. The hydrogen permeation prohibiting film is advantageously provided above all if the gate insulating film formed of a SiO based film is formed on the Si substrate.

If the SiON based thin film is formed by plasma CVD, the atomic composition ratio may be controlled based upon the flow ratio of the starting gases, so that it becomes possible to control the optical constants of the thin film. Consequently, by providing the SiON based thin film as the antireflection film, optimum light exposure may be achieved in dependence upon the type of the underlying layer or the exposure light employed.

In carrying out photolithography for fine patterning of the gate electrode, the SiON based thin film is employed as an antireflection film for prohibiting the light of reflection from the layer constituting the gate electrode. If this antireflection film is left after photolithography, the antireflection film is formed in a pattern common to that of the gate electrode.

If it is desired for the hydrogen diffused from the antireflection film not to reach the gate insulating film, it is convenient to form the hydrogen permeation prohibiting film to the common pattern as the gate electrode on the gate electrode below the antireflection film. If a sidewall is provided covering the lateral surface of the gate electrode, it is most desirable for the sidewall to have the function of prohibiting hydrogen permeation.

A SiON based thin film as an antireflection film is provided for photolithography for patterning the upper layer metallization for prohibiting the strong light of reflection from the upper layer metallization of high light reflectance, such as Al metallization. If the antireflection film is left after the photolithographic process, the antireflection film is deposited with the common pattern as that of the upper metallization layer. If an interlayer insulating film is further provided on the upper metallization layer and the photolithographic process is performed for patterning the interlayer insulating film, it becomes possible to prohibit the light of reflection from the upper metallization layer by the antireflection film present on the upper metallization layer.

If the antireflection film is formed in this manner on the upper metallization, the antireflection layer is formed in an area not coextensive as the area for forming the gate electrode, such that hydrogen contained in the antireflection film is diffused towards the gate insulating film from all possible directions from the site of the upper metallization layer. Thus it is desirable to provide the hydrogen permeation prohibiting film for covering the gate electrode for preventing hydrogen permeation from all possible directions.

The hydrogen permeation prohibiting film is preferably a SiN based thin film deposited by the LP-CVD method or a SiO based thin film deposited by high density plasma CVD method. These thin films are capable of prohibiting hydrogen permeation since they can be formed as extremely dense films. The high-density plasma CVD method may be enumerated by a magnetic micro-wave plasma (ECR) CVD method, a helicon wave plasma CVD method and an inductively coupled plasma (ICP) CVD method.

For forming the hydrogen permeation prohibitive film on the gate electrode to the same pattern as that of the gate electrode, a polysilicon layer and a tungsten silicide layer, for example, making up the gate electrode, are formed, and subsequently the hydrogen permeation prohibiting film is formed by any of the above methods. The antireflection film is then formed and the gate electrode is patterned to a desired configuration by photolithography and etching.

For forming the hydrogen permeation prohibiting film for covering the gate electrode, the SiN based thin film is formed on the entire wafer surface by the LP-CVD method after formation of the gate electrode or after forming an offset oxide film or a sidewall for covering the gate electrode, if so desired. Alternatively, a SiO based thin film may be formed as an interlayer insulating film by high density plasma CVD.

If the hydrogen permeation prohibiting film has a common pattern as the gate electrode, it is desirable to use a titanium film or a titanium silicide film as the hydrogen permeation prohibiting film, since such material has the properties of absorbing hydrogen.

The gate electrode is usually constituted by a polysilicon layer or an amorphous silicon layer. A high melting metal silicide layer is further deposited if lower electrical resistance is desired. According to the present invention, the Ti layer is deposited on the polysilicon layer or the amorphous silicon layer for constituting the gate electrode. Since the Ti layer is of an electrically conductive material, it naturally functions as a part of the gate electrode. However, since the Ti layer is able to absorb hydrogen diffused from the SiON based thin film, it also acts as a trap for prohibiting hydrogen from reaching the gate insulating film.

The gate electrode is convenient as containing a titanium silicide layer. That is, if the titanium silicide layer is provided on the polysilicon layer or the amorphous silicon layer, the gate electrode is of the polycide structure thus reducing the electrical resistance.

The titanium silicide layer may be formed by CVD as the titanium silicide layer. However, it is easier to from a Ti layer on the polysilicon layer or the amorphous silicon layer and to silicide Ti by heat treatment at a boundary region between the two layers. If this method is used, there is no risk of deterioration in productivity as compared to the process of forming a gate electrode having a usual polycide structure. However, for silicidation, it is necessary to set the film thickness and optimize the heat treatment conditions so that none of the polysilicon layer, amorphous silicon layer or the Ti layer will be consumed completely.

The reason is that it is the region inside the gate electrode edge that actually becomes a channel on a Si substrate and, if it is possible to prevent hydrogen from reaching the gate insulating film in this region, it becomes possible to prohibit deterioration in the resistance against hot carriers. That is, if the SiON based thin film persists with the common pattern as the gate electrode, hydrogen may be prohibited by the hydrogen permeation prohibiting film similarly having the same pattern as the gate electrode from reaching the gate insulating film in an area where at least the gate electrode is formed.

On the other hand, if the SiON based thin film is used for patterning the upper metallization layer and persists there-after, hydrogen contained in the antireflection film is diffused towards the gate insulating film from all possible directions from the site of the upper metallization layer. However, by providing the hydrogen permeation prohibiting film for covering the gate electrode, it becomes possible to prevent deterioration of the resistance against hot carriers.

The reason is that, by providing the hydrogen permeation prohibiting film for covering the gate electrode, the gate insulating film can be covered by the hydrogen permeation prohibiting film, so that hydrogen diffused from any direction may be prohibited from reaching the gate insulating film.

The number of steps is not increased if the interlayer insulating film has the function as the hydrogen permeation prohibiting film.

If a SiN based thin film, deposited by the LP-CVD method, or a SiO based thin film, deposited by the high-density plasma CVD method, is used as the above-mentioned hydrogen permeation prohibiting film, these films, which are extremely dense films, are superior in hydrogen permeation prohibiting effects, thus leading to improved reliability of the semiconductor devices.

On the other hand, if a titanium based thin film is used as the hydrogen permeation prohibiting film, since titanium has the hydrogen absorbing properties, it becomes possible to prevent hydrogen permeation from occurring.

With the semiconductor device according to the present invention, the hydrogen permeation prohibiting film is effective to render it difficult for hydrogen diffused from the SiON based thin film to reach the gate insulating film, as a result of which the resistance of the device against hot carriers may be improved significantly.

Above all, if the SiON based thin film is used for patterning the gate electrode, and allowed to persist, hydrogen diffusion occurs at a site close to the gate insulating film. However, the resistance of the device against hot carriers may be prohibited from being deteriorated by providing the hydrogen permeation prohibiting film having the common pattern as the gate electrode at a site below the SiON based thin film.

With the semiconductor device according to the present invention, since it is difficult for hydrogen diffused from the SiON based thin film to reach the gate insulating film, the resistance of the device against hot carriers is not deteriorated even if the SiON based thin film is left. In other words, the device may be significantly improved in resistance against hot carriers as compared to the conventional semiconductor device.

On the other hand, the titanium silicide layer, forming a portion of the gate electrode, may be easily formed at a boundary between the polysilicon layer or the amorphous silicon layer and the Ti layer by depositing the Ti layer on the polysilicon layer or the amorphous silicon layer and heat-treating the resulting structure. The gate electrode may be lowered in electrical resistance by the provision of the titanium silicide layer.

In addition, since the resistance of the semiconductor device against hot carriers otherwise caused by the persistence of the SiON based thin film is prohibited from being lowered, the step of removing the SiON based thin film in the production of the semiconductor device may be omitted. Furthermore, the SiON based thin film may be utilized for the subsequent photolithographic process, thus leading to improved productivity.

Consequently, the semiconductor deice having high operational reliability may be provided according to the present invention without raising production costs.

DESCRIPTION OF THE PREFERRED EMBODIMENTS

Referring to the drawings, preferred embodiments of the present invention will be explained in detail.

First Embodiment

The present embodiment is directed to a MOS transistor in which, for prohibiting hydrogen diffused from an antireflection layer used for patterning a gate electrode from reaching a gate insulating film, a hydrogen permeation prohibitive film having the common pattern as the gate electrode is formed below the antireflection film and above the gate electrode.

Figure 8:
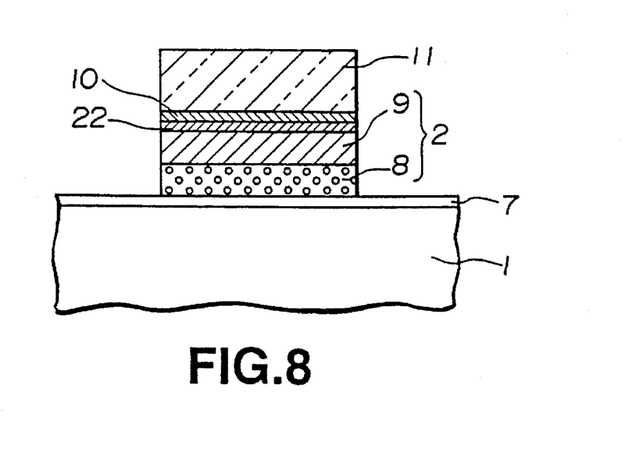
FIG. 8 is a schematic cross-sectional view showing the state in which, with the wafer of FIG. 7, the gate electrode has been patterned.

FIG. 8 shows a portion of the NOS transistor. A gate electrode 2 is formed on a gate insulating film 7 on a Si substrate 1 and is made up of a polysilicon layer 8 and a tungsten silicide layer 9. On the gate electrode 2 are formed a hydrogen permeation prohibiting film 22 of a SiN based thin film, an antireflection film 10 formed by a SiON based thin film and an offset oxidized film 11 formed of silicon oxide, in this order, and a sidewall 13 is formed for covering the lateral surface of the resulting structure.

Measurements of the electrical properties of the MOS transistor have revealed that resistance against hot carriers has been significantly improved as compared to the conventional MOS transistor. This is ascribable to the fact that, even although the antireflection film 10 formed by the SiON based thin film is left, the hydrogen permeation prohibiting film 22 operates for prohibiting hydrogen from reaching at least the portion of the gate insulating film V lying directly below the gate electrode 2.

Figure 7:
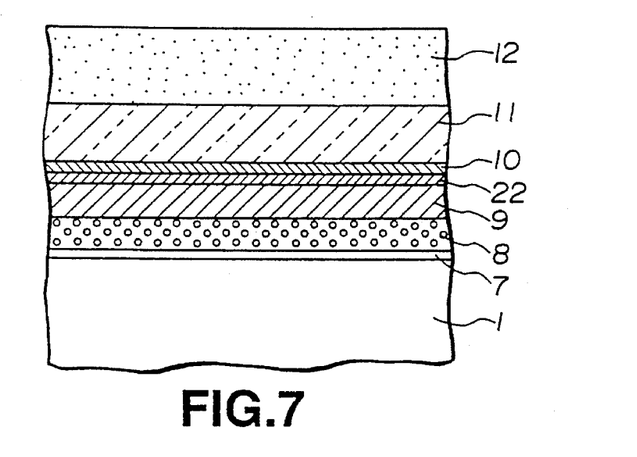
FIG. 7 shows a process for producing a wafer of FIG. 8 showing the state in which, after formation of a hydrogen transmission prohibiting film on a tungsten silicide film, an antireflection film, an offset oxide film and a photoresist film have been formed.

Referring to FIGS. 7 and 8, the process for fabrication of the above-described wafer is explained. First, a gate insulating film 7 is formed by heat oxidation on the Si substrate 1, and the polysilicon layer 8, tungsten silicide layer 9, hydrogen permeation prohibiting film 22, antireflection film 10, and the offset oxidized film 11, are formed by the CVD process, as shown in FIG. 7. Meanwhile, the hydrogen permeation prohibiting film 22 was formed using a LP-CVD device as a film-forming device and using 50 SCCM of $SiH_2Cl_2$ and 200 SCCM of $NH_3$ as starting gases at a temperature of 760° C. and under a pressure of 70 Pa. On the other hand, the antireflection film 10 was formed using a parallel flat plate type plasma CVD device as a film-forming device and using 50 SCCM of $SiH_4$ and 50 SCCM of $N_2O$ as starting gases at a temperature of 360° C. and under a pressure of 190 Pa, with the RF power being 190 W and with the electrode-to-electrode distance of 1 cm.

A photoresist coating film 12 was applied on the entire surface of the wafer and selectively exposed to light while the strong light of reflection from the tungsten silicide layer 9 was prohibited by the antireflection film 10. The photoresist coating film 12 was patterned to a desired shape by development and, using this as a mask, the offset oxidized film 11, antireflection film 10, hydrogen permeation prohibiting film tungsten silicide layer 9 and the polysilicon layer 8 were etched. Thus the gate electrode 2 was formed to a desired configuration and, on this gate electrode 2, the hydrogen permeation prohibiting film 22, anti-reflection film 10 and the offset oxide film 11 were patterned to the same pattern as the gate electrode 2, as shown in FIG. 8.

Figure 6:
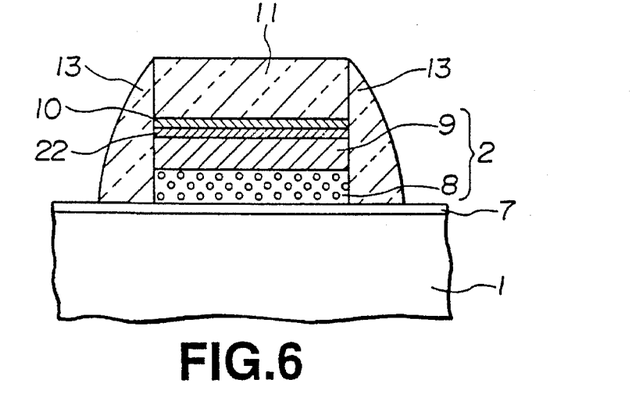
FIG. 6 is a schematic cross-sectional view showing an illustrative construction of a semiconductor device of the present invention in which hydrogen diffused from the antireflection film used for patterning the gate electrode is prohibited from reaching the gate insulating film.

Then, a layer of a SiO based material was formed on the entire surface of the wafer and anisotropically etched to form a sidewall 13 over the gate electrode 2, hydrogen permeation prohibiting film 22, antireflection film 10 and the offset oxide film 11 to produce a wafer as shown in FIG. 6. Although the explanation of the post-process of completing a MOS transistor is not made herein, it may be produced by the conventional steps of diffusion of impurities, activation and formation of upper metallization.

Second Embodiment

The present embodiment is directed to an SRAM having the structure of multi-layer metallization in which a gate electrode of a TFT as a load and a memory node are interconnected by a contact hole opened in a self-aligned manner in a SiO based interlayer insulating film on a Si substrate. There is provided a hydrogen permeation prohibiting film for covering the gate electrode for prohibiting hydrogen diffused from the antireflection film, employed for patterning the upper metallization, from reaching the gate insulating film.

Figure 9:
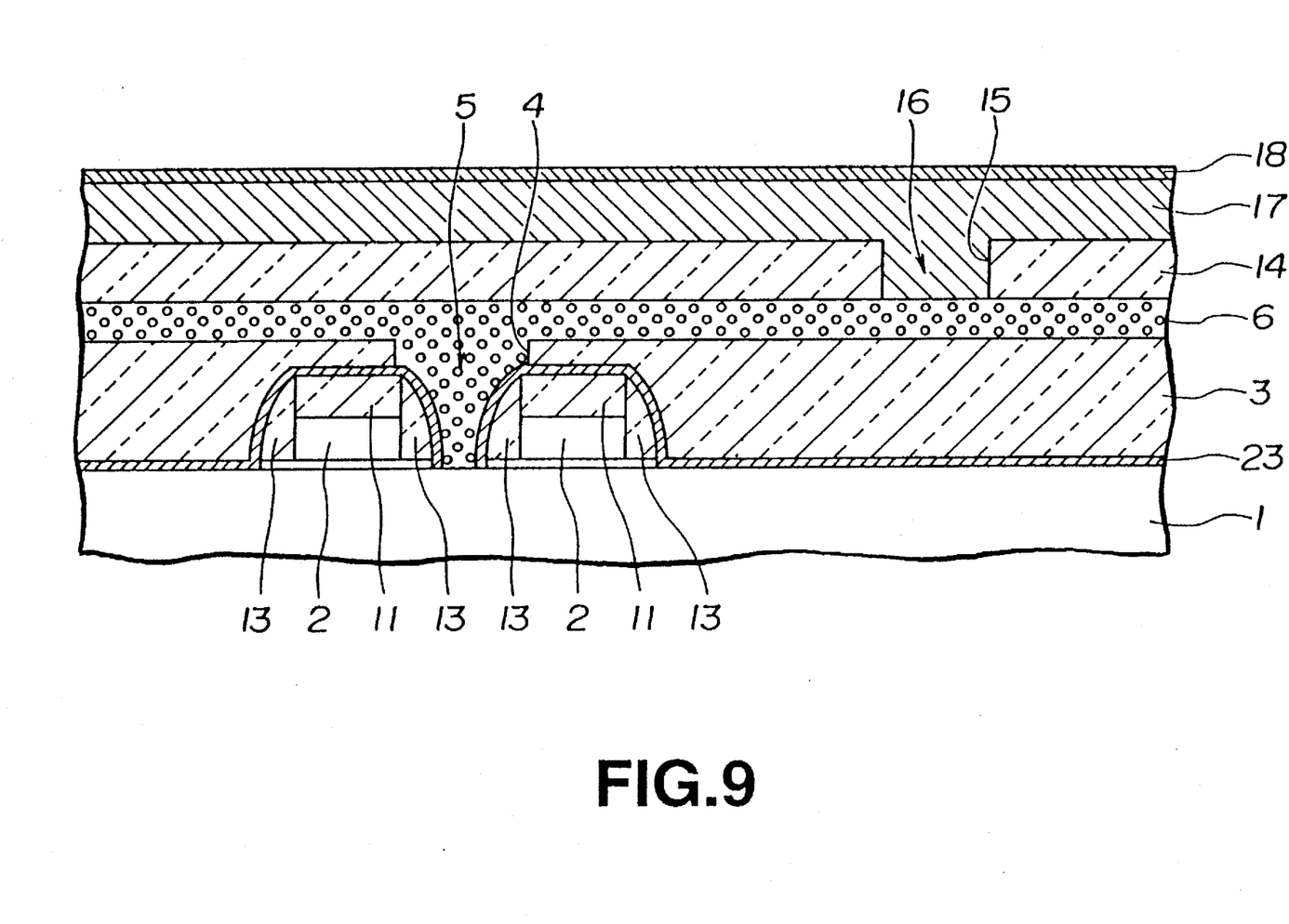
FIG. 9 is a schematic cross-sectional view showing an illustrative construction of a semiconductor device of the present invention in which hydrogen diffused from the antireflection film used for patterning the upper metallization is prohibited from reaching the gate insulating film.

FIG. 9 shows the present SRAM by a partial cross-sectional view. Two neighboring gate electrodes 2, provided in the same way as in Example 1, are covered by the offset oxidized film 11 and the sidewall 13. Between these gate electrodes 2 is formed a contact hole 4 in a self-aligned manner, and a hydrogen permeation prohibitive film 23, formed by a SiN based thin film, is formed around the offset oxide film 11 and the sidewall 13.

On the hydrogen permeation prohibitive film 23 are sequentially formed a SiO based interlayer insulating film 3, a polysilicon metallization layer 6, a SiO based interlayer insulating film 14, an Al metallization layer 17 and an antireflection film 18 formed by a SiON based thin film. The Si substrate 1 and the polysilicon metallization layer 6 are electrically interconnected by a polysilicon plug B buried in the contact hole 4 opened between the two gate electrodes 2, while the polysilicon metallization layer 6 and the Al metallization layer 17 are electrically interconnected by an Al plug 16 buried in a via-hole 15.

Measurements of electrical properties of the above-described SRAM have revealed that resistance against hot carriers have been improved significantly as compared to that of the conventional SRAM. This is ascribable to the fact that, although the antireflection film 18 formed by the SiON based thin film has been left, hydrogen permeation towards the gate insulating film 7 is completely prohibited by the hydrogen permeation prohibiting film 23 which covers both the upper portion and the lateral sides of the gate insulating film 7 thus prohibiting hydrogen from reaching the gate insulating film 7.

Figure 10:
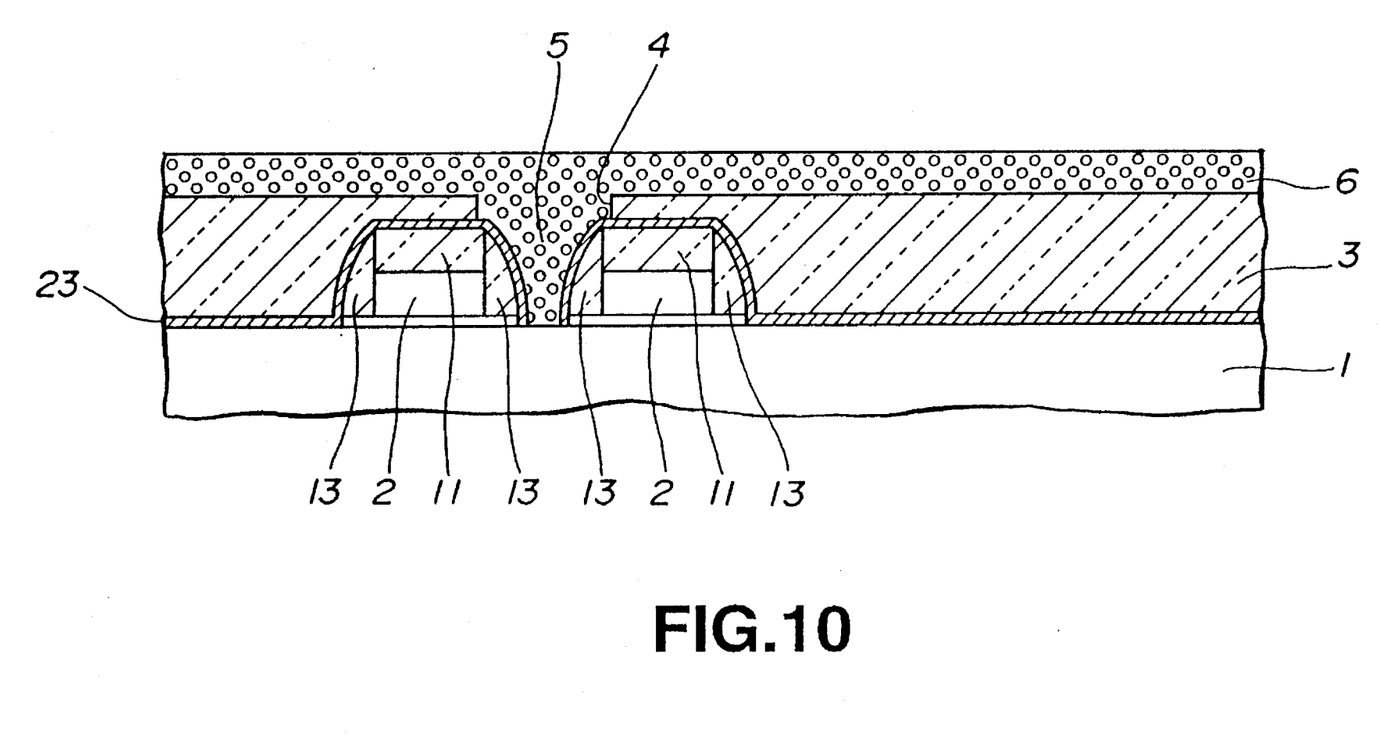
FIG. 10 shows a production process for a wafer of FIG. 9 showing state in which a hydrogen permeation prohibitive film is formed on a sidewall and an offset oxide film covering a gate electrode for establishing electrical connection between a substrate and a polysilicon metallization layer.
Figure 11:
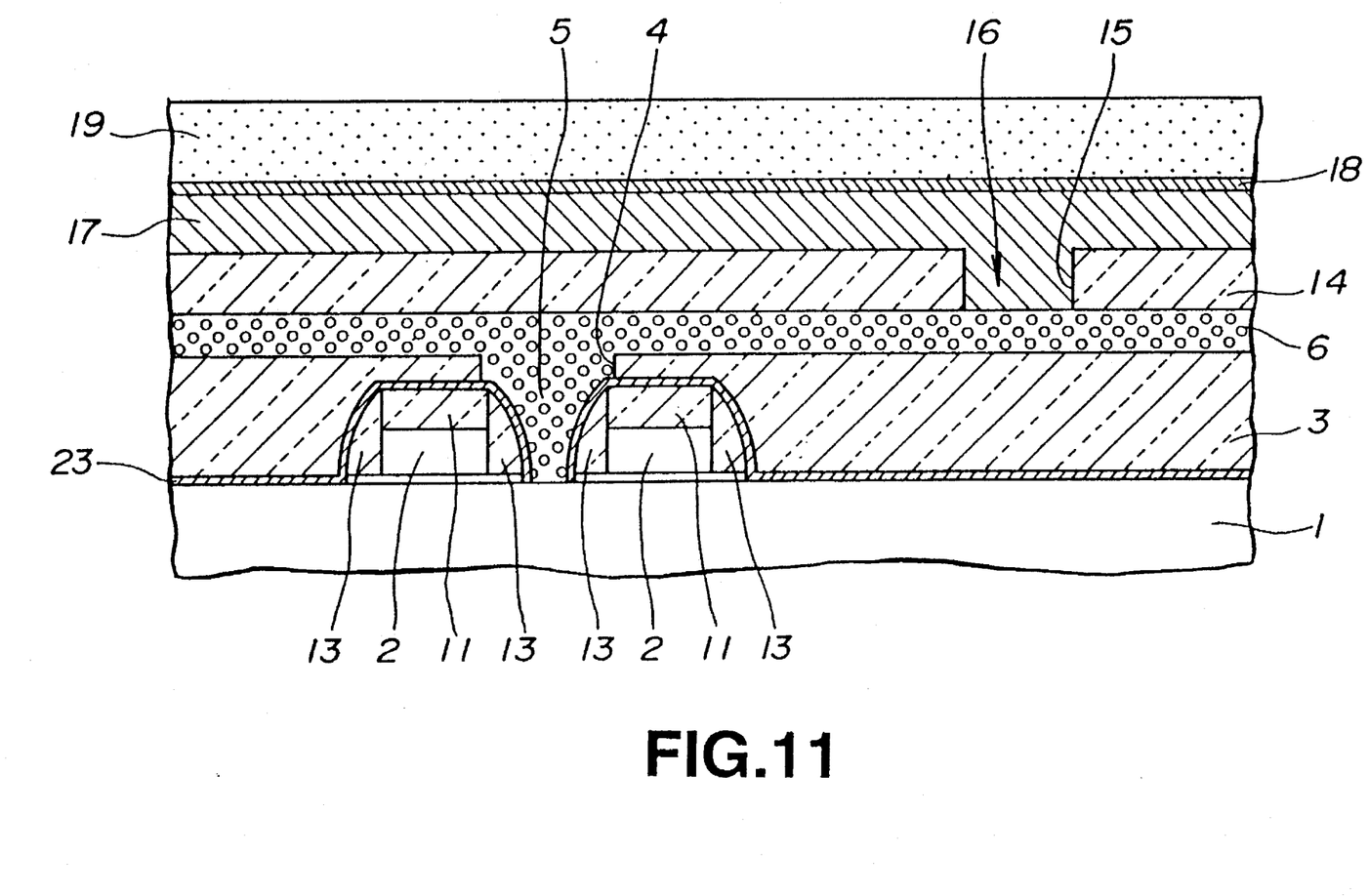
FIG. 11 is a schematic cross-sectional view showing the state in which, with the wafer of FIG. 10, an Al metallization layer for electrical connection to the polysilicon metallization layer has been formed and a photoresist coating film has been formed for patterning the Al metallization layer.

The production process for the above-described wafer is explained by referring to FIGS. 10 and 11. After the two gate electrodes 2, covered by the offset oxidized film 11 and the sidewall 13, are formed as explained in Embodiment 1, the hydrogen permeation prohibiting film 23, formed by a SiN based thin film, was deposited on the entire wafer surface. The hydrogen permeation prohibiting film 23 was deposited under the same film depositing conditions as those for the hydrogen permeation prohibiting film 22 provided in the embodiment 1 on the tungsten silicide film 9.

The contact hole 4 was then formed in the SiO based interlayer insulating film 3 between the two neighboring gate electrodes 2 for forming the polysilicon metallization layer 6, electrically connected to the Si substrate 1, as shown in FIG. 10. Specifically, the SiO based interlayer insulating film 3 is formed on the entire surface 3, and a photoresist coating film, not shown, is formed thereon. An opening pattern larger in size than the distance between the two neighboring gate electrodes 2 is formed in the photoresist coating film. Using this photoresist pattern as a mask, the SiO based interlayer insulating film 3 was etched, for forming the contact hole 4 in self-aligned manner, while the selection ratio with respect to the hydrogen permeation prohibiting film 23 was maintained. The polysilicon metallization layer 8 was then formed, while simultaneously burying the contact hole, and the polysilicon metallization layer 8 was patterned to a desired shape of metallization. Thus the Si substrate 1 and the polysilicon metallization layer 8 were electrically interconnected by the polysilicon lug 5 which was buried in the contact hole 4.

Then, an Al metallization layer 17, electrically connected to the polysilicon metallization layer 6, was formed, as shown in FIG. 11. Specifically, the SiO based interlayer insulating film 14 was formed for covering the polysilicon metallization layer 6, and the via-hole 15 was formed in the SiO based interlayer insulating film 14. The Al metallization layer 17 was then formed on the entire wafer surface while burying the via-hole 15. The antireflection film 18, formed by the SiON based thin film, was formed, and the photoresist coating film 19 was formed thereon. The photoresist coating film 19 was patterned to a desired shape by selective exposure followed by development, while prohibiting the strong light of reflection from the Al metallization layer 17. The antireflection film 18 and the Al metallization layer 17 were then etched, using the photoresist coating film 19 as the mask, for patterning to the desired shape of metallization. In this manner, the polysilicon metallization layer 6 and the Al metallization layer 17 were electrically interconnected by the Al plug 18 embedded in the via-hole 15.

Figure 12:
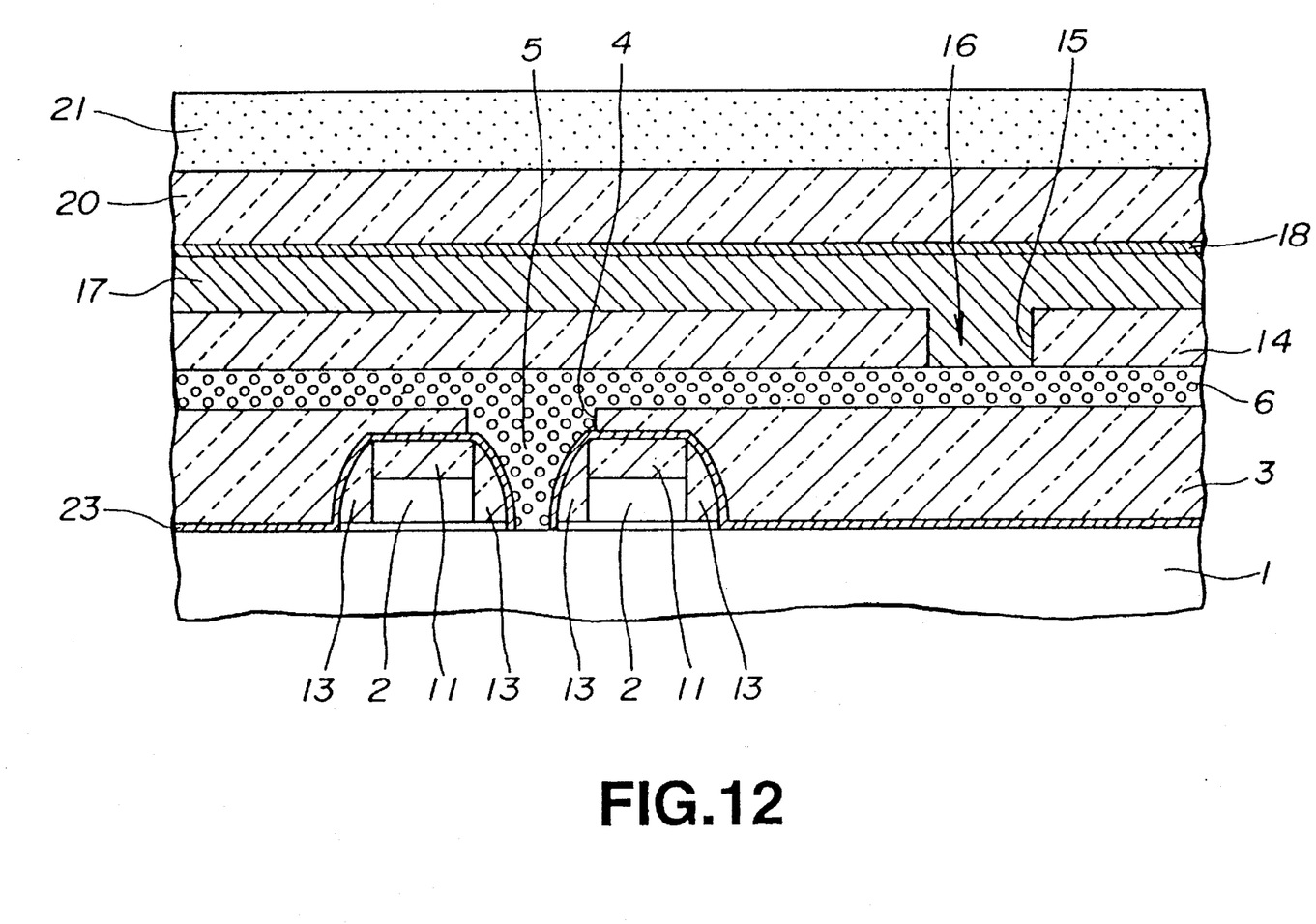
FIG. 12 is a schematic cross sectional view showing the state in which, with the wafer of FIG. 11, a photoresist coating film has been formed or opening a via-hole in a SiO based interlayer insulating film on the Al metallization layer of a second embodiment.

The wafer shown in FIG. 9 could be produced as described above. The antireflection film 18 on the Al metallization layer 17 can be removed, although the number of steps is then increased. On the other hand, when the SiO based interlayer insulating film 20 was formed on the wafer and patterned for producing a via-hole in the SiO based interlayer insulating film 20 by selective light exposure of the photoresist coating film 21 applied on the SiO based interlayer insulating film 20, it is necessary to prohibit the strong light of reflection from the Al metallization layer 17, as shown in FIG. 12. If the antireflection film 18 is left, it may be employed for this purpose. With this in view, the antireflection film 18 was left in the present embodiment.

Third Embodiment

The present embodiment is similarly directed to a SRAM of the multi-layer metallization structure. The interlayer insulating film, provided above the gate insulating film, has the function as the hydrogen permeation prohibiting film, in order to prohibit hydrogen diffused from the antireflection film used for pattering the upper layer metallization from reaching the gate insulating film.

Figure 13:
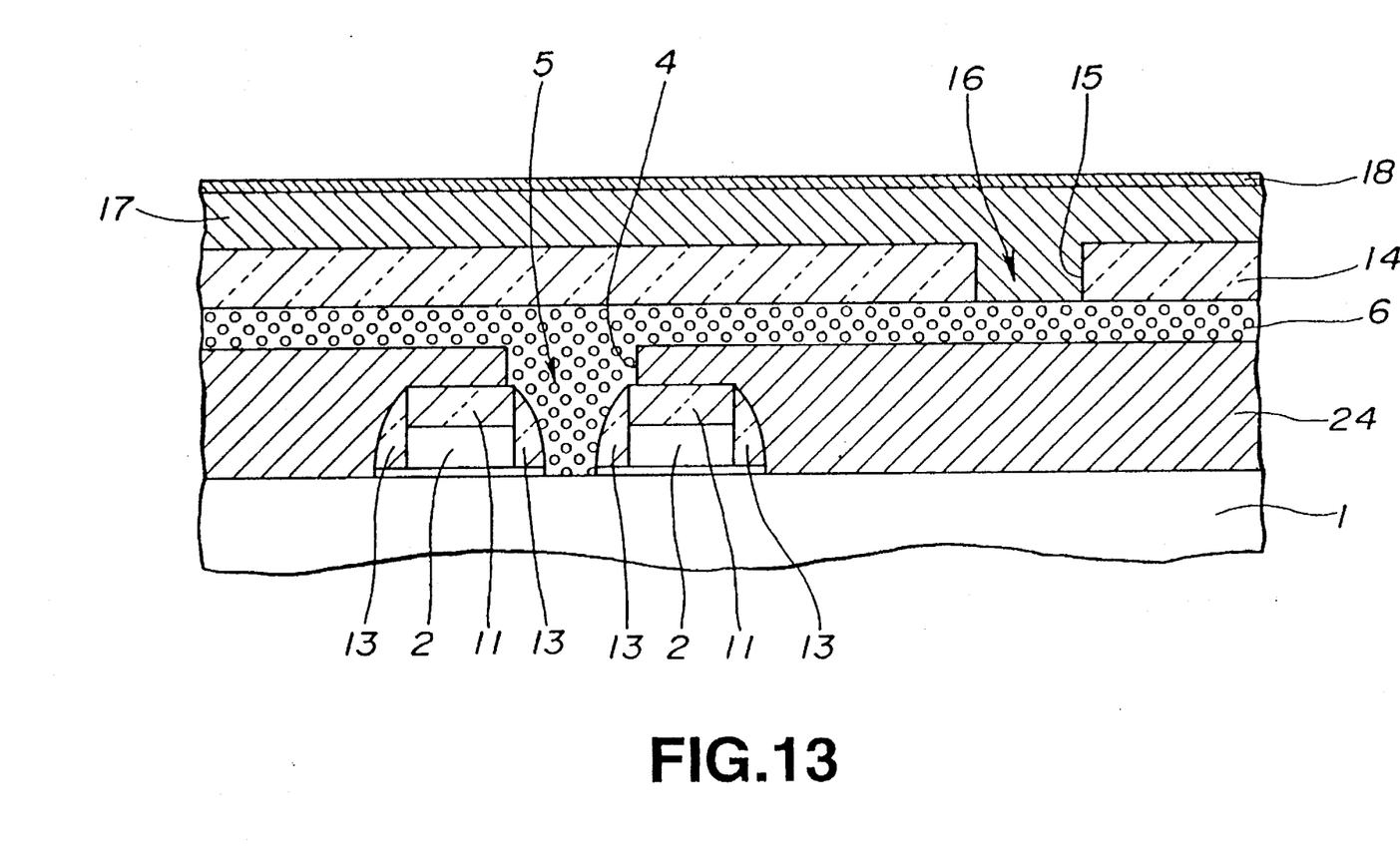
FIG. 13 is a schematic cross-sectional view showing a third embodiment of a semiconductor device.

The present embodiment is similar in construction to the embodiment 2 except that the hydrogen permeation prohibiting film 3 is not provided and a hydrogen permeation prohibiting interlayer insulating film 24 is provided in place of the SiO based interlayer insulating film 3, as shown in a partial cross-sectional view of FIG. 13.

Measurements of electrical properties of the above-described SRAM have revealed that resistance against hot carriers has been improved significantly as compared to that of the conventional SRAM. This is ascribable to the fact that, although the antireflection film 18 formed by the SiON based thin film has been left, hydrogen permeation towards the gate insulating film 7 is completely prohibited by the hydrogen permeation prohibiting interlayer insulating film 24 which covers both the upper portion and the lateral sides of the gate insulating film 7 thus prohibiting hydrogen permeation towards the gate insulating film 7 for obstructing hydrogen reaching the gate insulating film 7.

For producing the above-described wafer, the two electrodes 2, covered by the offset oxide film 11 and the sidewall 13, were formed, as described in the embodiment 1, and the hydrogen permeation prohibiting interlayer insulating film 24 was formed on the entire wafer surface. The hydrogen permeation prohibiting interlayer insulating film 24 was formed using an ECR-CVD device as a film device and using 50 SCCM of $SiH_4$ and 10000 SCCM of $O_2$ as starting gases, at a micro-wave power of 1000 W and an RF bias power of 500 W and under a pressure of $1 \times 10^{-3}$ torr.

The polysilicon metallization layer 6 for electric interconnection with the Si substrate 1 between the two gate electrodes 2, was then formed, and subsequently the Al metallization layer 17 for electrical interconnection with the polysilicon metallization layer 6 was formed.

This completed the wafer shown in FIG. 13. In this wafer, since the antireflection film 18 can be re-used for patterning for forming a via-hole in the SiO based interlayer insulating film provided for covering the Al metallization layer 17 after patterning the Al metallization layer 17, the antireflection film 18 was left.

The present invention is not limited to the above-described embodiments, but may be modified in many ways. For example, although the side wall 18 is formed in the embodiment 1 as conventionally, this sidewall 13 may be constructed from a layer of a SiN based material, deposited in accordance with the LP-CVD method, or from a layer of a SiO based material, deposited n accordance with the high density plasma CVD method, in which case it becomes possible to prevent permeation of hydrogen diffused from the transverse direction towards the gate insulating film 7. The hydrogen permeation prohibiting film 22 is provided on the gate electrode 2 and, in addition, the hydrogen permeation prohibiting film 28 or the hydrogen permeation prohibiting interlayer insulating film 24 is formed in the embodiments 2 and 3. However, if the pattern size of the gate electrode 2 is large and the antireflection film 10 is not needed in patterning the gate electrode 2, there is no necessity of providing the hydrogen permeation prohibiting film 22 on the gate electrode 2. The wafer construction or the film-forming conditions for the respective material layers are also not limited to those described in the previous embodiments.

Fourth Embodiment

Since a Ti layer has the properties of absorbing hydrogen, hydrogen diffused from a SiON based thin film provided above the gate electrode can hardly reach the gate insulating film if part of the gate electrode is constituted by the Ti layer. For this reason, even if the gate insulating film is formed of a SiO based material, it becomes possible to increase resistance against hot carriers and to improve reliability of a semiconductor device.

On the other hand, if a titanium silicide layer is contained in the gate electrode, the electrical resistance may be lowered as compared to the case in which the gate electrode is formed only by a polysilicon layer or an amorphous silicon layer.

There is also no risk of the resistance against hot carriers being lowered in case the SiON based thin film is employed as an antireflection film for patterning the gate electrode and/or in case the SiON based thin film is used as an antireflection film for patterning the metallization, for the following reason.

It is a region neighboring to a channel region which should be controlled most strictly in the gate insulating film insofar as the film quality is concerned. Since the channel region is defined between the source and drain regions, it is controlled by the extent of the source and drain regions. Since the source drain region and the drain region are provided by implanting impurities into the substrate, using the gate electrode as a mask, and by activating and diffusing the diffused impurities, the channel region is disposed slightly inwardly of the edge of the gate electrode. Since the Ti layer in the present invention has a gate electrode pattern, the gate insulating film neighboring to the channel region is substantially protected from both hydrogen diffused from the SiON based thin film on the gate electrode and hydrogen diffused from the SiON thin film on the upper metallization layer. If the good film quality of the gate insulating film in the region thereof neighboring to the channel region is maintained, it becomes possible to improve resistance against hot carriers.

Figure 14:
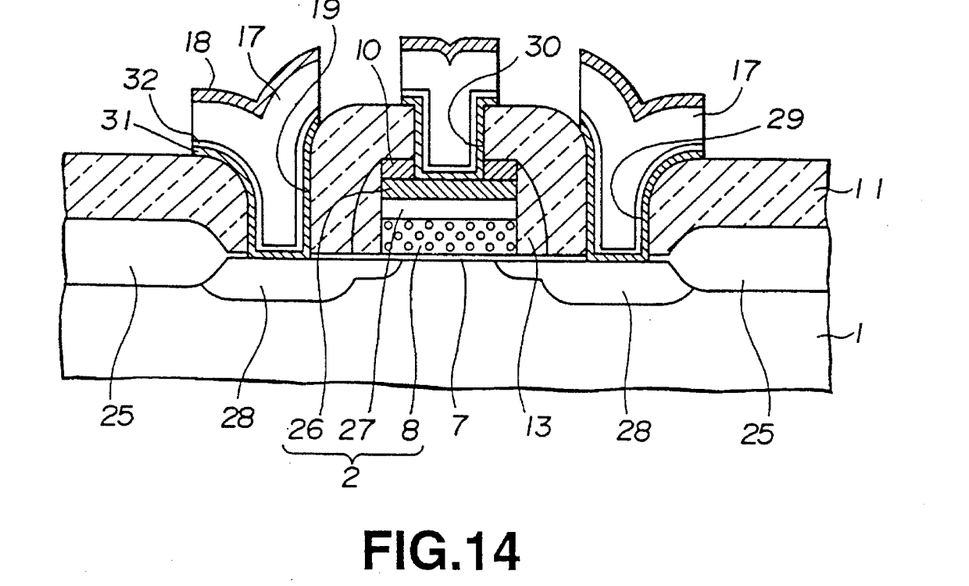
FIG. 14 is a schematic cross-sectional view of a fourth embodiment.

FIG. 14 shows a MOS transistor in which a gate electrode 2, made up of a polysilicon layer 8, a Ti layer 26 and a titanium silicide layer 27, sandwiched therebetween, is formed on a Si substrate 1, in which a device isolating region 25 and a gate insulating film 7 have been formed. On the gate electrode 2 is formed an antireflection film 10, formed by a SiON based thin film, with a common pattern to that of the gate electrode 2. On both lateral side of the gate electrode is formed a sidewall 13. A SiO based interlayer insulating film 3 and an Al based metallization layer 17 are formed thereabove. The Al-based metallization layer 17 is electrically connected, via a contact hole 29 formed in the SiO based interlayer insulating film 3, to a source-drain region 28, while being electrically connected via a contact hole 30 with the gate electrode 9.

Below the Al based metallization layer 17 are formed a Ti film 31 and a TiN film 32, employed as barrier metal layers. On the Al-based metallization layer 17, an antireflection film 18, formed by a SiON based thin film, is stacked with the common pattern to that of the Al-based metallization layer 17.

Measurements of the electrical properties of the above-described MOS transistor revealed that resistance against hot carriers cold be significantly improved as compared to a conventional MOS transistor not having the Ti layer 28 in the gate electrode 2. Thus it has been found that, if the antireflection films 10, 18, formed by SiON based thin films, are left, hydrogen may be prohibited from reaching the gate insulating film 7 by the Ti film 28 of the gate electrode 28.

The above-described MOS transistor may be fabricated by the process which is now explained by referring to FIGS. 15 to 18.

Figure 15:
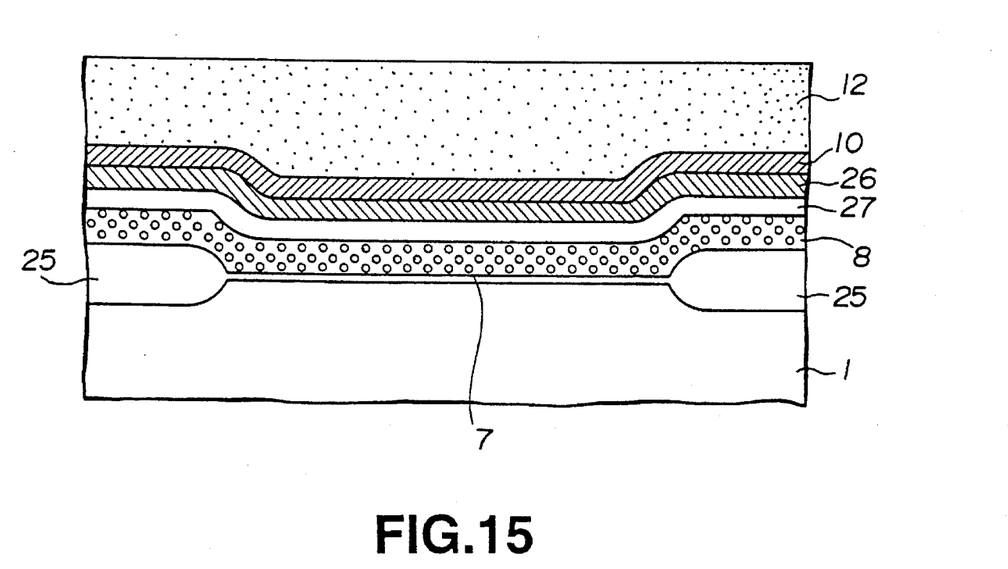
FIGS. 15–18 show the process steps of making the fourth embodiment.

Referring first to FIG. 15, the n-type polysilicon layer 8, the titanium silicide layer 27 and the Ti layer 28, as constituent layers of the gate electrode 2, were formed on the Si substrate, on which the device isolating region 25 and the gate insulating film 7 have been formed. The antireflection film 10 and the photoresist coating film 12 were also formed.

Specifically, the device isolating region 25 was formed to a thickness of 270 nm by selective oxidation in accordance with the so-called LOCOS method, and a gate insulating film 7 was formed to a thickness of 8 nm by thermal oxidation at 850° C. in an atmosphere composed of $H_2$ and $O_2$ gases. Then, using $SiH_4$ and $PH_3$ as starting gases, CVD was carried put at 550° C. for depositing a n-type polysilicon layer 8 to a film thickness of 70 nm. Then, sputtering was carried out for depositing a Ti layer 28 to a film thickness of 30 to 100 nm.

The, rapid thermal annealing (ETA) was carried out at 600° C. for 20 seconds in order to effect Ti silicidation at an interface between the polysilicon layer 8 and the Ti layer 28 for forming the titanium silicide layer 27. Then, using $SiH_4$ and $N_2O$ as starting gases, plasma CVD was carried out at 360° C. for forming an antireflection film 10 formed by a SiON based thin film on the Ti layer 28. The photoresist coating film 12 was subsequently formed. The optical constants of the antireflection film 10 were set so that the real part n of the complex refractive index was equal to 2.10 and a coefficient k of an imaginary part thereof was equal to 0.62.

Figure 16:
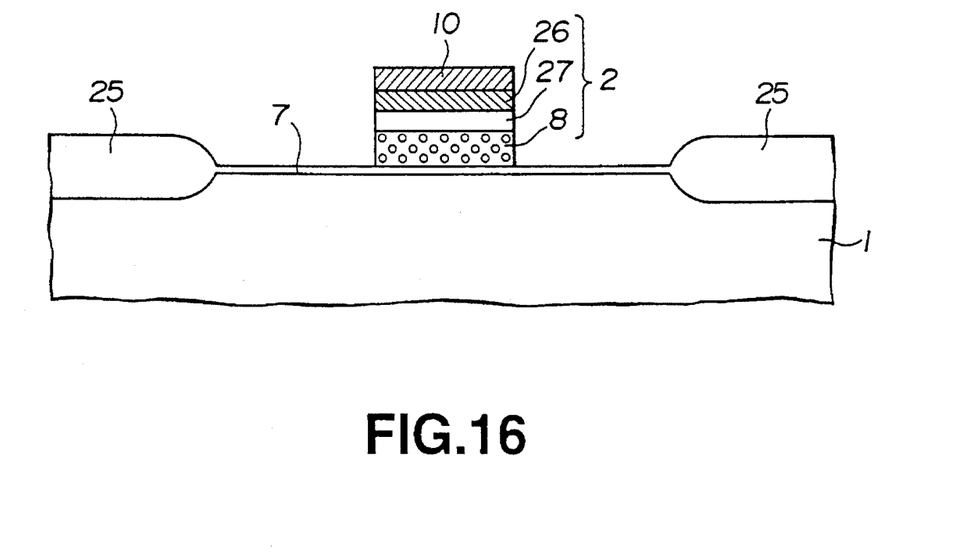

The gate electrode 2 was then patterned, as shown in FIG. 18. Specifically, the photoresist coating film 12 was selectively exposed to light, using the exposure light having a wavelength of 248 nm, while the strong light of reflection from the Ti layer 26 was prohibited by the antireflection film 10. Then, using the photoresist pattern, formed by the development process, as a mask, the antireflection film 10, Ti layer 28, titanium silicide layer 27 and the polysilicon layer 8 were etched by reactive ion etching (RIE) whereby the gate electrode 2 patterned to a desired configuration could be formed. Since the antireflection film 10 was not removed, the film 10 was left on the gate insulating electrode 2.

Figure 17:
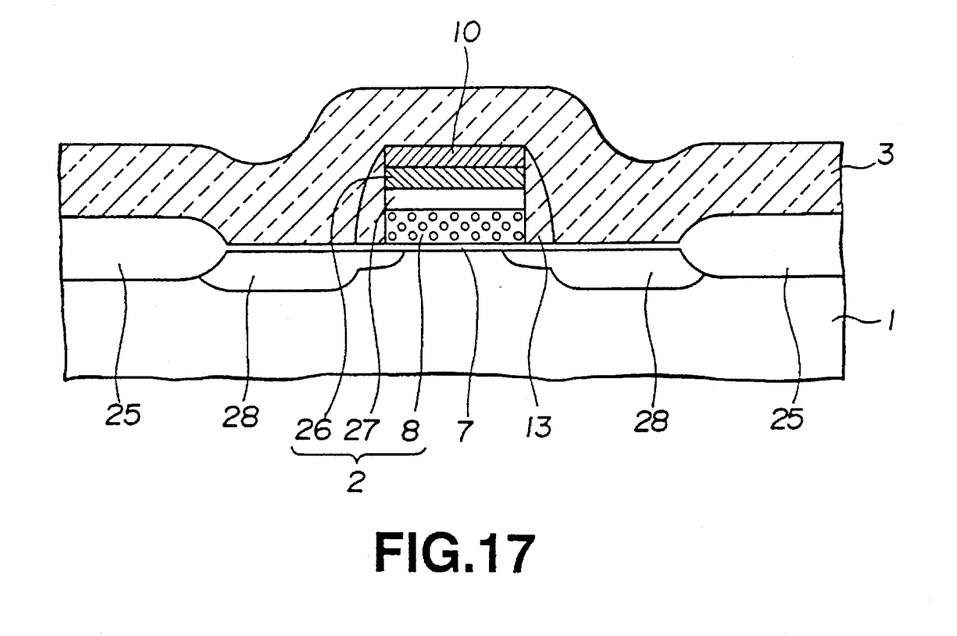

Then, as shown in FIG. 17, a sidewall 13 and a SiO based interlayer insulating film 3 were formed. Specifically, the $SiO_2$ layer was formed by CVD to a thickness of 150 nm on the entire wafer surface for covering the gate electrode 2 formed as described above, and the sidewall 13 was then formed for covering both lateral sides of the gate electrode 2. The SiO based interlayer insulating film 13 was then formed to a film thickness of 30 nm by CVD. Before forming the sidewall 13, As was ion-implanted under conditions of the ion acceleration energy of 20 keV and a dosage of $6 \times 10^{12}/cm^2$ for forming a shallow diffusion area and, after forming the sidewall 13, As was ion-implanted under conditions of the ion acceleration energy of 20 keV and a dosage of $3 \times 10^{15}/cm^2$ for forming a deep diffusion area. Then, RTA was carried out at 1050° C. for 10 seconds for activating and diffusing the implanted impurities at 1050° C. for ten seconds for forming the source-drain region 28.

Figure 18:
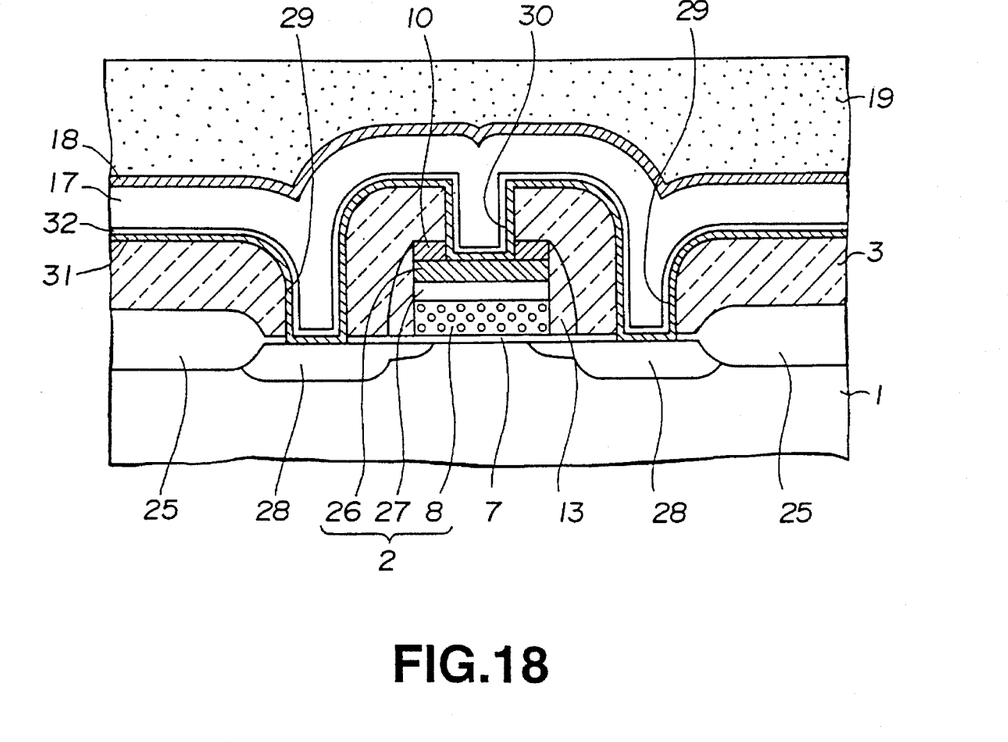

Then, as shown in FIG. 18, the Al-based metallization layer 17, electrically connected to the source/drain region 28 and the gate electrode 2, was formed, as shown in FIG. 18.

Specifically, the contact hole 29 opened in the source/drain region 28 and the contact hole 30 opened in the gate electrode 2 were formed by the photolithographic process and etching for the SiO based interlayer insulating film B. During this photolithographic process for forming the contact holes the reflected light from the Ti layer 28 was prohibited by the antireflection film 7.

The Ti film 31 and the TiN film 32 were thin formed by sputtering from the wafer surface to thicknesses of 30 nm and 70 nm, respectively, for covering the inside of the contact holes 29, 30. The Al-based metallization layer 17, containing 1% of Si, was formed by sputtering to a film thickness of 300 nm, while burying the contact holes 29, 30. The antireflection film 18 was then formed on the Al-based metallization layer 17 to a film thickness of 23 nm, and subsequently the photoresist coating film 19 was formed thereon. The optical constants of the antireflection film 18 were set so that the real part n of the complex refractive index was equal to 2.16 and a coefficient k of an imaginary part thereof was equal to 0.875.

The photoresist coating film 19 of the above-described wafer was selectively etched, using an exposure light having a wavelength of 248 nm, while the strong light of reflection from the Al-based metallization layer 17 was prohibited by the antireflection film 18. Subsequently, the photoresist coating film 19 was patterned by development to a desired configuration. Using the patterned film 19 as a mask, the antireflection film 18, Al-based metallization layer 17, Ti film 31 and the TiN film 32 were etched by RIE for patterning the Al-based metallization layer 17 to the desired configuration. Subsequently, the photoresist coating film 19 was removed and annealing was performed at 400° C. under a gas atmosphere composed of $N_2$ gas admixed with 2% of $H_2$ gas for completing the MOS transistor shown in FIG. 14.

Since the antireflection film 18 was not removed, the film 18 was left on the Al-based metallization layer 17. This antireflection film 18 operates for prohibiting the reflected light from the Al-based metallization layer 17 when performing patterning for forming a via-hole in the SiO based interlayer insulating film, not shown, provided for covering the patterned Al-based metallization layer 17.

The present invention is not limited to the above-described illustrative embodiments. Since the Ti layer 26 capable of absorbing hydrogen diffused from the antireflection film is formed as a part of the gate electrode 2, the antireflection film may be left at any position higher in level than the Ti layer 26. That is, the antireflection film may be present at any position instead of being disposed on the gate electrode 2 or on the Al-based metallization layer 17. Of course, if the gate electrode 2 has a large pattern size such that there is no necessity of providing the antireflection film 10 for patterning the gate electrode 2, it is unnecessary to provide the antireflection film at the above-mentioned position. The wafer construction or the conditions for forming the various layers may be modified from those explained in the embodiments. For example, an amorphous silicon layer may be provided in place of the polysilicon layer in the gate electrode

What is claimed is:

1. A semiconductor device comprising:

a substrate;

a gate insulating film formed on the surface of said substrate;

a gate electrode formed on said gate insulating film;

a first antireflection film having a pattern in common with said gate electrode, said first antireflection film containing hydrogen and being formed on said gate electrode; and a hydrogen permeation prohibiting film formed between said gate insulating film and said first antireflection film.

2. The semiconductor device as claimed in claim 1, wherein said gate insulating film is formed of a silicon oxide based material.

3. The semiconductor device as claimed in claim 1, wherein said first antireflection film is a silicon oxynitride based film.

4. The semiconductor device as claimed in claim 1, further comprising an upper metallization layer formed on said substrate, and a second antireflection film formed on said upper metallization layer, said second antireflection film containing hydrogen and having a pattern in common with said upper metallization layer.

5. The semiconductor device as claimed in claim 4, wherein said second antireflection film is formed of a silicon oxynitride based material.

6. The semiconductor device as claimed in claim 3, wherein said hydrogen permeation prohibiting film is formed for covering said gate electrode.

7. The semiconductor device as claimed in claim 6, wherein said hydrogen permeation prohibiting film is an interlayer insulating film between the gate electrode and the upper metallization layer.

8. The semiconductor device as claimed in claim 1, wherein said hydrogen permeation prohibiting film is a silicon nitride based film formed by low-pressure chemical vapor deposition method.

9. The semiconductor device as claimed in claim 1, wherein said hydrogen permeation prohibiting film is a silicon oxide based film formed by the plasma CVD method.

10. The semiconductor device as claimed in claim 1, wherein said hydrogen permeation prohibiting film is a titanium film and is formed as part of said gate electrode.

11. The semiconductor device as claimed in claim 1, wherein said hydrogen permeation prohibiting film is a titanium silicide film and is formed as part of said gate electrode.

* * * * *